United States Patent
Wang

[11] Patent Number: 6,143,596
[45] Date of Patent: Nov. 7, 2000

[54] PLANARIZATION FOR INTERLAYER DIELECTRIC

[75] Inventor: Kao-Hsing Wang, Kaohsiung, Taiwan

[73] Assignee: Vanguard International Semiconductor Corporation, Hsinchu, Taiwan

[21] Appl. No.: 09/189,741

[22] Filed: Nov. 10, 1998

[51] Int. Cl.[7] ............................................. H01L 21/8244
[52] U.S. Cl. .................... 438/238; 438/240; 438/241; 438/253; 438/254; 438/624; 437/52; 437/60; 437/200; 437/931; 437/950
[58] Field of Search .................... 438/238, 253, 438/254, 239, 240, 241, 624; 437/52, 60, 931, 950, 47, 200

[56] References Cited

U.S. PATENT DOCUMENTS

| | | | |
|---|---|---|---|
| 4,879,257 | 11/1989 | Patrick | 438/624 |
| 5,668,036 | 9/1997 | Sune | 438/254 |
| 5,691,223 | 11/1997 | Pittikoun et al. | 437/52 |
| 5,824,581 | 10/1998 | Tseng | 438/253 |

*Primary Examiner*—David Nelms
*Assistant Examiner*—Phuc T. Dang
*Attorney, Agent, or Firm*—Christensen O'Connor Johnson Kindness PLLC

[57] ABSTRACT

The method includes forming a first dielectric layer on a wafer having cell area and cell boundary. The first dielectric layer is etched to generate a plurality of holes. A polysilicon layer is next conformally deposited on the surface of the contact holes and on the first dielectric layer. A photoresist is coated on the polysilicon layer and into the holes. Next, a CMP (chemical mechanical polishing) is performed to remove the polysilicon layer that are over the first dielectric layer. The photoresist is then stripped, therefore forming a crown shape structure over the wafer. A second photoresist pattern is patterned on the first dielectric layer to cover the cell boundary, thereby leaving exposed the crown shape structure. Subsequently, an etching process is used to etch the first dielectric layer. Then, the second photoresist pattern is stripped. A further dielectric such as oxide layer is redeposited both on the cell area and the cell boundary to obtain a planar surface.

12 Claims, 5 Drawing Sheets

PLANARIZATION FOR INTERLAYER DIELECTRIC

FIELD OF THE INVENTION

The present invention relates to a semiconductor process, and more particularly, to a method of planarizing an interlayer dielectric used in integrated circuits.

BACKGROUND OF THE INVENTION

With the rapid development of integrated circuit technologies, there has been a continuous drive to reduce the size of these circuits. As the devices are miniaturized and features become more closely spaced, the tolerance of process parameters becomes more critical because minute defects will cause the devices to fail. For example, layers of conductive and insulative materials are generally patterned to form a desired structure and to perform certain functions, such as transistors, resistors and metal lines.

The planarization of these layers greatly influences the efficacy of the subsequent photolithography. If the topography is not smooth enough, the patterned layer would be distorted after the patterning. In addition, the uneven surface of these layers will cause problems in subsequent overlying layers.

Prior arts have been developed to planarize the surface of a layer. For example, an organic-based glass such as spin on glass (SOG) is typically used for planarization. In general, the SOG layer is formed over a layer by using a spin-coating method. However, the spin-coating method is primarily effective for localized planarization. In addition, an etching back is generally used after the SOG is coated. To achieve an equal etching rate of both the underlying oxide layer and SOG layer is difficult and depends upon the features of in the underlying layers.

Another popular method of planarization is the use of borophosphosilicate glass (BPSG). Generally, BPSG requires a deposition step and an etch step to achieve a planar surface. However, where there is a great step height between the cell and cell boundary (or periphery area), the topography after the formation of the BPSG is uneven. In addition, the process requires a thermal step to reflow the BPSG at high temperature. Therefore, what is required is a method to solve the aforesaid deficiencies.

SUMMARY OF THE INVENTION

It is an object of the present invention to achieve planar surface of a wafer having a protruding pattern formed thereon.

It is another object of the present invention is to planarize the oxide formed on a crown shaped structure.

A first dielectric layer is formed on a wafer having cell area and periphery area. The first dielectric layer is then etched to expose a portion of the layer on the cell area, thereby generating a plurality of holes in the layer. A polysilicon layer is next conformally deposited on the surface of the contact holes and on the first dielectric layer. A photoresist is coated on the polysilicon layer and into the holes as a stop layer for subsequent process. Next, a CMP (chemical mechanical polishing) is performed to remove the polysilicon layer and photoresist that are over the dielectric layer.

The photoresist is stripped by well known technology. Therefore, a protruding feature or a crown shape structure is formed over the wafer. The crown shape structure is formed in the device area or cell area. A dummy pattern is typically formed around the patterned array. A second photoresist pattern is patterned on the first dielectric layer to cover the cell boundary, thereby leaving exposed the crown shape structure. Subsequently, an etching process is used to etch the first dielectric layer. Then, the second photoresist pattern is stripped. The crown shape structure is used as a capacitor node for the application of making capacitor. A further dielectric such as oxide layer is redeposited both on the cell area (device area) and the cell boundary to obtain a planar surface. A planarization can be optionally performed to achieve a smooth topography be chemical mechanical polishing or etching back.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method to planarize a wafer having protruding features or patterned array formed thereon. The present invention includes applying a dummy pattern while forming the patterned array. Further, photomasking and etching will also be introduced in the present invention.

Figure 1:
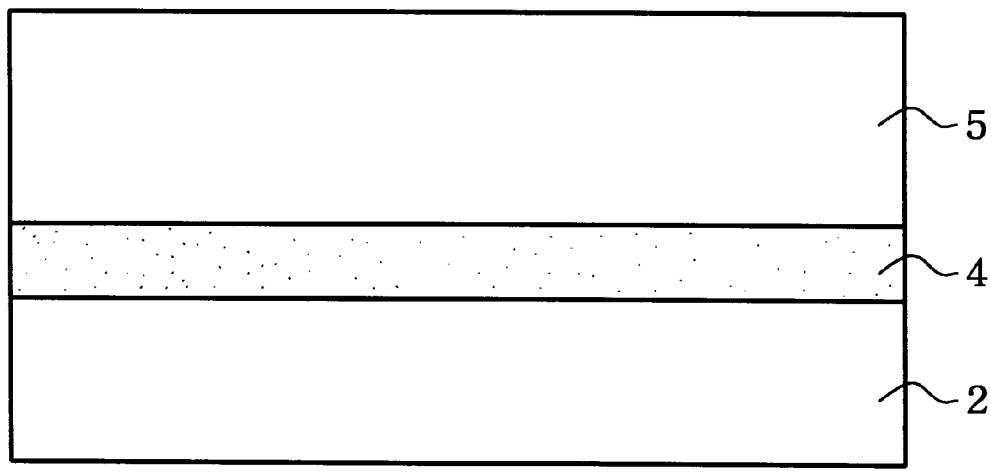
FIG. 1 is a cross section view of a semiconductor wafer illustrating the step of forming an isolation layer and a first dielectric layer over the wafer in accordance with the present invention.
Figure 2:
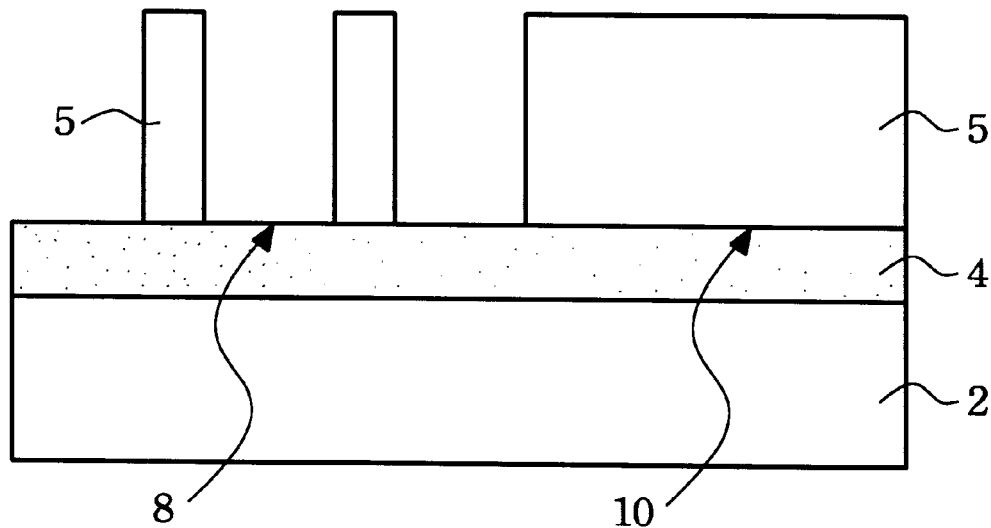
FIG. 2 is a cross section view of a semiconductor wafer illustrating the step of etching the first dielectric layer on a cell area in accordance with the present invention.

Turning to FIG. 1, an integrated circuit structure 2 can be a semiconductor wafer including layers formed in and on the wafer. A layer 4 for isolation may be formed over the wafer 2. The isolation layer 4 can be oxide, nitride or the like. Devices can be formed in or under the isolation layer 4. The isolation layer 4 is not a feature of the present invention and therefore a detailed description will not be given. A dielectric layer 5 such as oxide or the like is subsequently formed on the isolation layer 4, followed by etching the dielectric layer 5 on a cell area (or device area) of the substrate to expose a portion of the layer 4, thereby generating a plurality of holes in the layer 5, as shown in FIG. 2. In this step, a patterned array will be defined in the dielectric layer 5. An area 10 adjacent to the cell area 8 is called the cell boundary or periphery area. The oxide layer 5 is formed by chemical vapor deposition to cover the periphery area 10 and cell area 8. The material for the oxide layer 5 can be selected from silicon oxide, BPSG, BSG, PSG, TEOS-oxide, SOG or the like.

Figure 3:
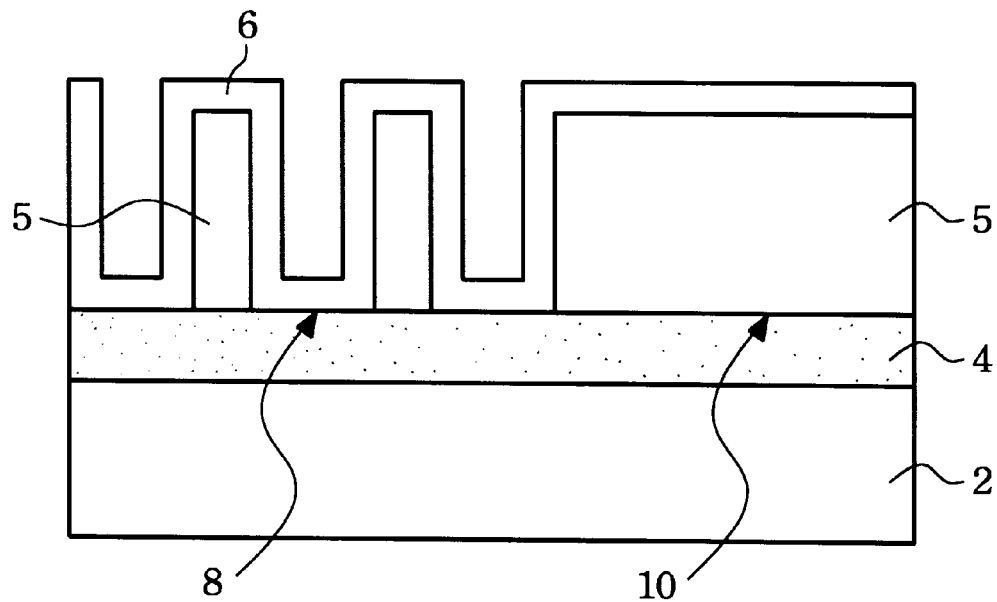
FIG. 3 is a cross section view of a semiconductor wafer illustrating the step of forming a polysilicon layer on the first dielectric layer in accordance with the present invention.
Figure 4:
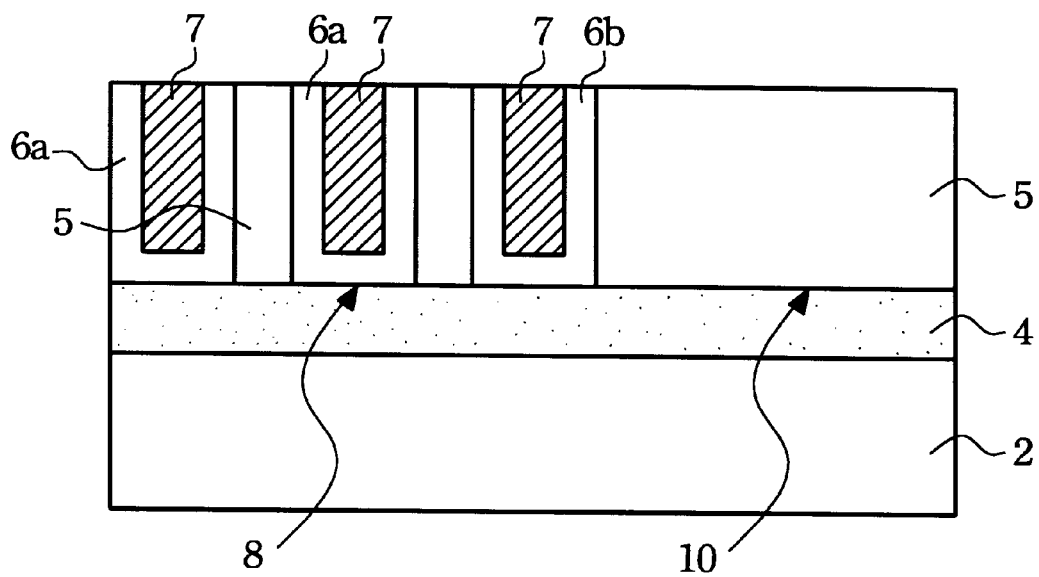
FIG. 4 is a cross section view of a semiconductor wafer illustrating the step of forming a first photoresist and removing a portion of the polysilicon layer in accordance with the present invention.

Turning to FIG. 3, a conductive layer 6, for example polysilicon layer, is next conformally deposited on the surface of the contact holes and on the dielectric layer 5. As shown in FIG. 4, photoresist 7 is coated on the polysilicon layer 6 and into the holes as a stop layer for subsequent process. Preferably, the photoresist 7 is at least formed in the holes. Next, a CMP (chemical mechanical polishing) is performed to remove the polysilicon layer and photoresist 7 that are over the dielectric layer 5. Alternatively, the polysilicon 6 can be removed by etching process using the photoresist 7 as a mask.

Figure 5:
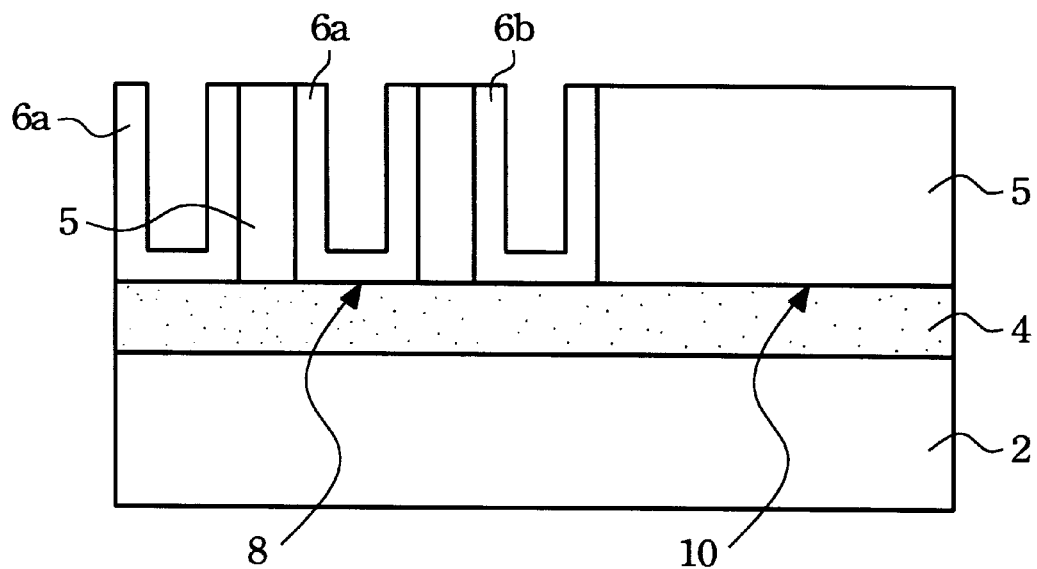
FIG. 5 is a cross section view of a semiconductor wafer illustrating the step of stripping the first photoresist in accordance with the present invention.

Please turn to FIG. 5, the photoresist 7 is successively stripped by well known technology. Therefore, the patterned array 6a is formed over the wafer 2. For example, the patterned array 6a may be a crown shape or other shaped capacitor array for a DRAM array. The patterned array 6a is formed in the device area or cell area 8 (in the case of a capacitor). A dummy pattern 6b is typically formed around the patterned array 6a to eliminate the optical proximity effect and to act as an etching stop layer. The dummy pattern 6b is not a part of the cell area 8, but is present along the entire edge of the patterned array 6a.

Figure 6:
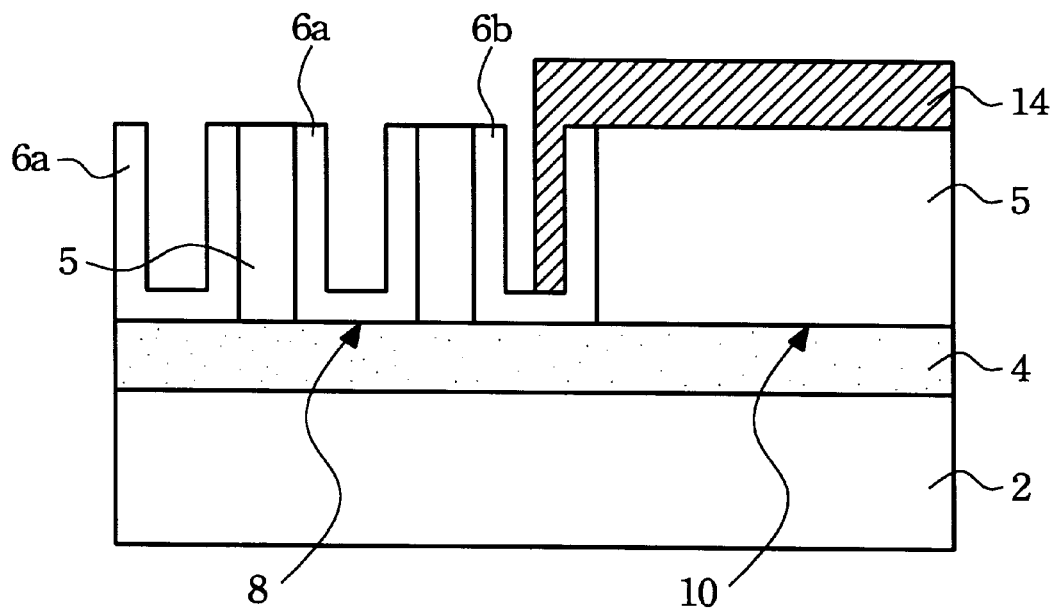
FIG. 6 is a cross section view of a semiconductor wafer illustrating the step of forming a second photoresist on the first dielectric layer on a cell boundary in accordance with the present invention.
Figure 7:
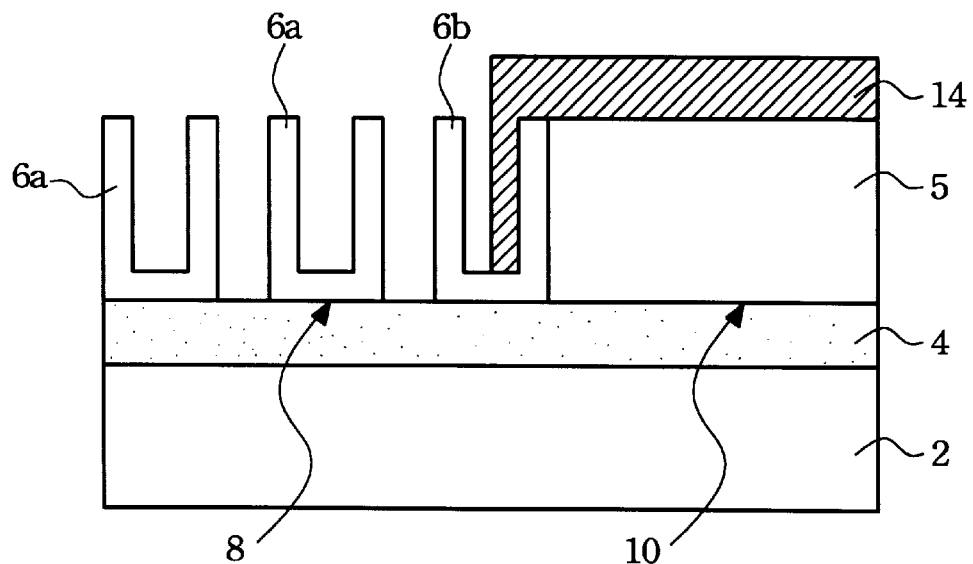
FIG. 7 is a cross section view of a semiconductor wafer illustrating the step of etching the first dielectric layer using the second photoresist as a mask in accordance with the present invention.

Turning to FIG. 6, a photoresist pattern 14 is patterned on the oxide layer 5 to cover the cell boundary 10, thereby leaving exposed the patterned array 6a. As can be seen in FIG. 6, a portion of the dummy crown structure 6b is also covered by the photoresist pattern 14. Subsequently, an etching process is used to etch the oxide layer 5 that remains between the pattern array 6a, namely, the part that is not covered by the photoresist pattern 14, as shown in the FIG. 7. The oxide 5 inside and outside of the crown-shaped structures are removed. Then, the photoresist pattern 14 is stripped. The crown-shaped structure 6a is used as a capacitor node for the application of making capacitor.

Figure 8:
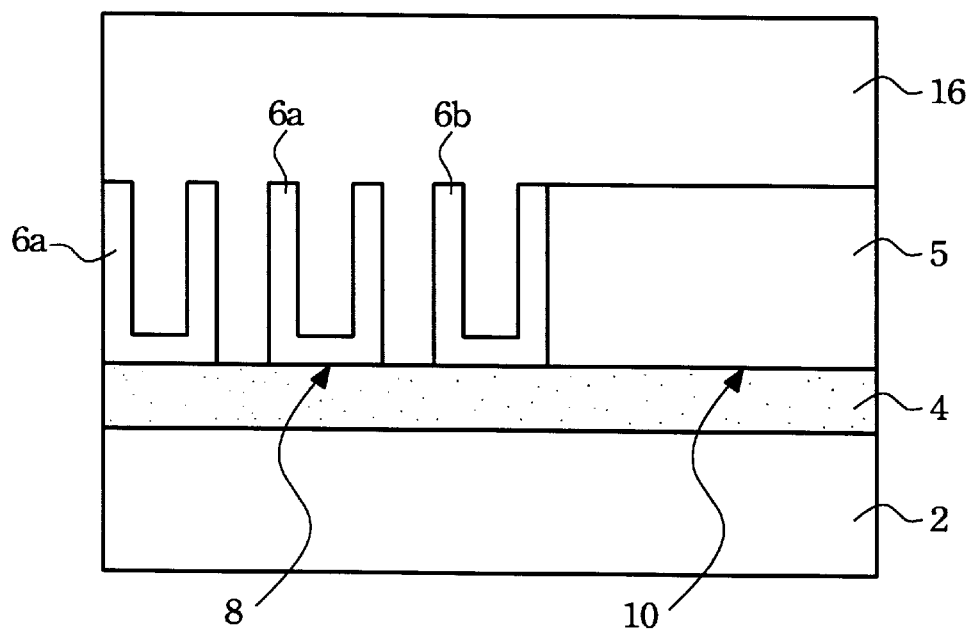
FIG. 8 is a cross section view of a semiconductor wafer illustrating the step of forming a second dielectric layer in accordance with the present invention.

Referring to FIG. 8, a further dielectric such as oxide layer 16 is redeposited both on the cell area (device area) 8 and the cell boundary 10 to obtain a planar surface. A planarization can be optionally performed to achieve a smooth topography by chemical mechanical polishing or etching back. If the processes are used to manufacture a capacitor array, a capacitor dielectric and a further capacitor node (not shown) have to be formed on the capacitor node 6a before forming the second oxide 16. This is well known in the art.

Figure 9A:
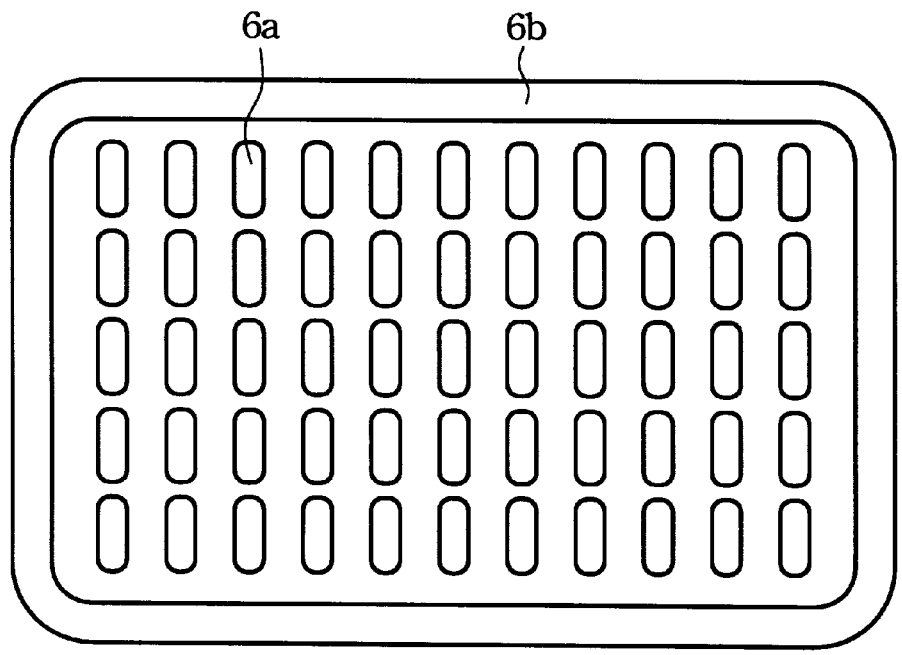
FIGS. 9A, 9B are the top view and cross sectional view of the crown structure with the dummy pattern, respectively.
Figure 9B:
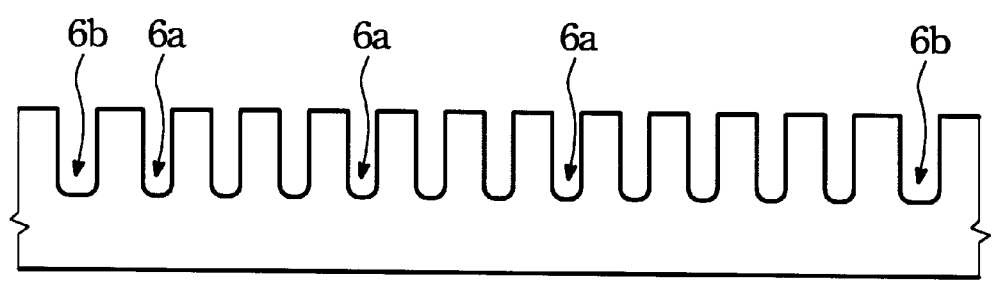

FIGS. 9A, 9B are the top view and cross sectional view of the crown structure with the dummy pattern, respectively. The layout for semiconductor devices or capacitor array includes a pattern array 6a formed in a dielectric layer on the device area of a wafer for making an element of semiconductor devices such as capacitors. A dummy pattern 6b is formed at the region between the device area and the periphery area, and the dummy pattern 6b is also formed in above dielectric layer and surrounds the pattern array for filling a photoresist in the dummy pattern 6b and covering on the periphery area for planarization. Preferably, the dummy pattern 6b can be a ring-shape trench surrounding the pattern array. The dummy pattern can solve the problem associated with the uneven surface as mentioned in the background.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of planarizing a wafer having a device area and a periphery area, the method comprising the steps of:

forming a first dielectric layer over said device area and said periphery area;

etching said first dielectric layer to create a pattern having holes on said device area;

forming a polysilicon layer along the surface of said pattern;

forming a first photoresist in said holes;

removing a part of said polysilicon layer being formed over the top surface of said first dielectric layer;

stripping said first photoresist, thereby forming a pattern array and a dummy pattern around said pattern array;

forming a second photoresist on said first dielectric layer that on said periphery area and said second photoresist covering a portion of said dummy pattern;

removing said first dielectric layer on said device area and leaving said first dielectric layer on said periphery area; and forming a second dielectric layer on said pattern array and said first dielectric layer.

2. The method of claim 1, further comprising planarizing said second dielectric layer after forming said second dielectric layer.

3. The method of claim 1, wherein said polysilicon is removed by chemical mechanical polishing.

4. The method of claim 1, wherein said polysilicon is removed by etching using said first photoresist as a mask.

5. A method of planarizing a wafer having a cell area and a cell boundary, the method comprising the steps of:

forming a first oxide layer over said cell area and said cell boundary;

etching said first oxide to create a plurality of holes in said first oxide;

forming a polysilicon on said first oxide and along the surface of said plurality of holes;

forming a first photoresist in said plurality of holes;

removing a part of said polysilicon layer being formed over the top surface of said first oxide;

stripping said first photoresist, thereby forming a first capacitor node on said cell area, and a dummy pattern around said first capacitor node;

forming a second photoresist on said first oxide layer that on said cell boundary, said second photoresist covering a portion of said dummy pattern;

removing said first oxide layer on said cell area and leaving said first oxide on said cell boundary;

forming a capacitor dielectric layer on said first capacitor node;

forming a second capacitor node on said capacitor dielectric layer, thereby forming a capacitor;

forming a second oxide layer on said capacitor and said first oxide layer.

6. The method of claim 5, further comprising planarizing said second oxide layer after forming said second oxide layer.

7. The method of claim 5, wherein said polysilicon is removed by chemical mechanical polishing.

8. The method of claim 5, wherein said polysilicon is removed by etching using said first photoresist as a mask.

9. A method of planarizing a wafer having a cell area and a cell boundary, the method comprising the steps of:

forming a first oxide layer over said cell area and said cell boundary;

etching said first oxide to create a plurality of holes in said first oxide;

forming a polysilicon on said first oxide and along the surface of said plurality of holes;

forming a first photoresist in said plurality of holes;

removing a part of said polysilicon layer being formed over the top surface of said first oxide;

stripping said first photoresist, thereby forming a crown-shaped structure as a first capacitor node on said cell area, and a dummy pattern around said crown-shaped structure;

forming a second photoresist on said first oxide layer which is on said cell boundary, said second photoresist covering a portion of said dummy pattern;

removing said first oxide layer on said cell area and leaving said first oxide on said cell boundary;

forming a capacitor dielectric layer on said first capacitor node;

forming a second capacitor node on said capacitor dielectric layer, thereby forming a crown-shaped capacitor on said cell area;

forming a second oxide layer on said crown-shaped capacitor and said first oxide layer.

10. The method of claim 9, further comprising planarizing said second oxide layer after forming said second oxide layer.

11. The method of claim 9, wherein said polysilicon is removed by chemical mechanical polishing.

12. The method of claim 9, wherein said polysilicon is removed by etching using said first photoresist as a mask.

* * * * *